United States Patent
Huang et al.

(10) Patent No.: US 10,950,411 B2
(45) Date of Patent: Mar. 16, 2021

(54) CONTROL METHOD FOR MULTI-PHASE WINDING DEFLECTION SCANNING DEVICE

(71) Applicant: Guilin THD Technology Co., Ltd., Guilin (CN)

(72) Inventors: Xiaodong Huang, Guilin (CN); Shouqi Wei, Guilin (CN); Xiang Fei, Guilin (CN); Yujiang Qin, Guilin (CN); Yang Dong, Guilin (CN); Fengbin Huang, Guilin (CN); Wenming Guo, Guilin (CN)

(*) Notice: Subject to any disclaimer, the term of this patent is extended or adjusted under 35 U.S.C. 154(b) by 0 days.

(21) Appl. No.: 16/745,377

(22) Filed: Jan. 17, 2020

(65) Prior Publication Data

US 2020/0152413 A1 May 14, 2020

(51) Int. Cl.
*H01J 37/147* (2006.01)

(52) U.S. Cl.
CPC ... *H01J 37/1475* (2013.01); *H01J 2237/1526* (2013.01)

(58) Field of Classification Search
CPC .. H01J 37/147; H01J 37/1472; H01J 37/1474; H01J 2237/1526; H01J 2237/152
See application file for complete search history.

(56) References Cited

U.S. PATENT DOCUMENTS 8,378,312 B1 * 2/2013 Gordon ............... A61N 5/1043
250/396 R

FOREIGN PATENT DOCUMENTS

CN          104570918 A  *  4/2015

* cited by examiner

*Primary Examiner* — David E Smith
(74) *Attorney, Agent, or Firm* — HYIP

(57) ABSTRACT

The present invention discloses a control method for a multi-phase winding deflection scanning device, comprising: defining a rectangular coordinate system where deflection scanning tracks are located; sequentially decomposing the deflection scanning tracks into finite point rectangular coordinate data; translating the rectangular coordinate data into corresponding point resultant exciting current data; decomposing the resultant exciting current data into n-phase winding exciting current data; and translating the n-phase winding exciting current data into corresponding n-phase control instruction electrical signals and outputting same to a drive power supply, amplifying the output electrical signals by the drive power supply and providing same for the multi-phase winding deflection scanning device as exciting current.

9 Claims, 7 Drawing Sheets

Sector

CONTROL METHOD FOR MULTI-PHASE WINDING DEFLECTION SCANNING DEVICE

TECHNICAL FIELD

The present invention relates to the technical field of charged particle beam processing equipment, and more particularly to a control method for a multi-phase winding deflection scanning device.

BACKGROUND

At present, a magnetic deflection scanning device of conventional charged particle beam processing equipment mainly comprises: a ferromagnetic frame and a deflection scanning winding, wherein the ferromagnetic frame of the magnetic deflection scanning device is of an axisymmetric structure, and has a deflection scanning winding with two phase axes which are orthogonal. When a charged particle beam requires a large wide-angle deflection, for example, powder-bed electron-beam additive manufacturing equipment uses more than two phases of deflection scanning winding, the axes of all the phases of winding are symmetrically distributed on a cross section of the deflection scanning device, which increases the uniform distribution of the magnetic induction intensity in the effective range of the deflection scanning device, and then reduces the additional defocusing effect of the deflection scanning device on the charged particle beam; in addition, from the perspective of the drive circuit, the use of the multi-phase deflection scanning winding is more beneficial to extending the working broadband of the deflection scanning device.

However, compared with the two-phase winding deflection scanning device, the multi-phase winding deflection scanning device has obvious disadvantages, among them the most prominent one is that there is no one-to-one correspondence between the resultant exciting current of the multi-phase winding deflection scanning device and the exciting current of each phase. Due to the nonlinearity of the ferromagnetic circuit, different decomposition modes of the resultant exciting current may cause errors in the scanning position and the uncertainty of additional defocusing correction values. In order to give full play to the advantages of the multi-phase winding deflection scanning device and overcome the disadvantages thereof, there is a need to improve and innovate the control method.

Thus, the problem to be urgently solved by those skilled in the art is how to achieve one-to-one correspondence between the resultant magnetomotive force and the component magnetomotive force of the deflection scanning device, to control the multi-phase winding deflection scanning device.

SUMMARY

In view of this, the present invention provides a control method for a multi-phase winding deflection scanning device. It can be derived from the Lorentz force equation $\vec{f} = Q\vec{v} \times \vec{B}$ B that: after the charged particle beam passes through the deflection scanning device in the axial direction, the charged particle beam axis is offset to the vertical direction of the resultant magnetic field axis of the cross section of the deflection scanning device, the taper angle of the offset is proportional to the amplitude of the resultant magnetomotive force of the cross section of the deflection scanning device, that is, the charged particle beam is required to be offset a certain displacement from the original position when the axial flight speeds are the same, the resultant magnetomotive force of the deflection scanning device is unique, however, when the number of winding phases the deflection scanning device is greater than 2, the allocation of the component magnetomotive force of each phase of winding is not unique. For the purpose of control, the resultant magnetomotive force is decomposed into the magnetomotive force components of each phase of winding according to a definite rule, and one-to-one correspondence between the resultant magnetomotive force space vector and the magnetomotive force component of each phase is established. In view of the fact that the phases of winding of the multi-phase winding deflection scanning device have the same number of turns and are symmetrical in structure, the magnetomotive force control is converted into exciting current control, which plays a key bridge role for the digital control of the multi-phase winding deflection scanning device, and provides guarantee for accurate correction of astigmatism caused by deflection scanning.

To achieve the above purpose, the present invention adopts the following technical solution:

A control method for a multi-phase winding deflection scanning device, comprising:

step 1: defining a coordinate axis;

step 2: discretizing and digitizing a deflection scanning track of the multi-phase winding deflection scanning device, obtaining rectangular coordinate data (x, y) of finite scanning points on the deflection scanning track, and saving the data;

step 3. translating the rectangular coordinate data (x, y) of the scanning points on the deflection scanning track into resultant exciting current data ($I_d$, $I_q$), where $I_d$ represents direct axis component data, and $I_q$ represents quadrature axis component data;

step 4. decomposing the resultant exciting current data ($I_d$, $I_q$) into n-phase winding exciting current data $I_1, I_2, \ldots, I_n$ according to a definite rule;

step 5: generating n-phase control instruction electrical signals $I_1^*, I_2^*, \ldots, I_n^*$ according to the n-phase winding exciting current data $I_1, I_2, \ldots, I_n$; and step 6: generating n-phase exciting current according to the n-phase control instruction electrical signals $I_1^*, I_2^*, \ldots, I_n^*$, wherein the multi-phase winding deflection scanning device achieves the function of controlling the deflection scanning track.

Preferably, a control system for the multi-phase winding deflection scanning device controls a deflection scanning track of a charged particle beam, the control system for the multi-phase winding deflection scanning device comprising a central controller, a drive power supply, and a multi-phase winding deflection scanning device, wherein the central controller is connected with the drive power supply, and the drive power supply is connected with the multi-phase winding deflection scanning device; the multi-phase winding deflection scanning device is mounted at the outlet end of a charged particle beam generator, a charged particle beam generated by the charged particle beam generator is projected onto the work scanning plane by the deflection scanning device, to form the deflection scanning track on the work scanning plane; the drive power supply generates n-phase exciting current according to the n-phase control instruction electrical signals $I_1^*, I_2^*, \ldots, I_n^*$ transmitted by the central controller, so that the multi-phase winding deflection scanning device controls the spot center of the charged particle beam on the work scanning plane to be offset to the rectangular coordinate system (x, y) position.

Preferably, the step 1 is specifically implemented as follows: adjusting the position of the deflection scanning device, so that the winding of the $1^{st}$ phase controls the deflection scanning track of the spot center of the charged particle beam on the work scanning plane to be coincide with the x axis of the rectangular coordinate system and consistent with same in the forward direction, wherein the axis of the winding of the $1^{st}$ phase is defined as a direct axis on the cross section of the deflection scanning device, when looking additionally distributed n−1 phases of winding from the projection on the work scanning plane, the n−1 phases of winding are defined as the $2^{nd}, 3^{rd}, \ldots, n^{th}$ phases of winding of the deflection scanning device in sequence in the counterclockwise direction of the winding of the $1^{st}$ phase; when the resultant exciting current is zero, the position of the spot center of the charged particle beam projected on the work scanning plane is defined as the origin (0, 0) of the rectangular coordinate system on the work scanning plane.

Preferably, the step 3 is specifically implemented as follows: proportionally converting, by the central controller, the rectangular coordinate data (x, y) of the deflection scanning track point into corresponding point resultant exciting current data ($I_d$, $I_q$), i.e.

$$I_d = \lambda x$$

$$I_q = \lambda y \quad (1)$$

where in equation (1), $\lambda$ is a constant, and different device $\lambda$ values are obtained by experiment.

Preferably, the step 4 is specifically implemented as follows: decomposing, by the central controller, the resultant exciting current data ($I_d$, $I_q$) obtained in the step 3 into the n-phase winding exciting current data $I_1, I_2, \ldots, I_n$ according to the circular scanning track principle or 2n-regular-polygon scanning track principle.

Preferably, the step 5 is specifically implemented as follows: inputting, by the central controller, the n-phase winding exciting current data $I_1, I_2, \ldots, I_n$, obtained in the step 4 into an n-channel D/A converter respectively to convert same into corresponding n-phase control instruction electrical signals $I_1^*, I_2^*, \ldots, I_n^*$, and transmitting the electrical signals to the instruction signal input end of a corresponding n-phase drive circuits in the drive power supply respectively.

Preferably, the step 6 is specifically implemented as follows: receiving, by the drive power supply, the n-phase control instruction electrical signals $I_1^*, I_2^*, \ldots, I_n^*$ and transmitting same to the n-phase drive circuit in the drive power supply, linearly amplifying the electrical signals, by the n-phase drive circuit, and then transmitting to corresponding phase deflection scanning winding in the multi-phase winding deflection scanning device as the exciting current respectively.

Preferably, according to the exciting current space vector concept, the resultant exciting current space vector of the n phases of phase exciting current symmetrically distributed on the cross section of the multi-phase winding deflection scanning device is $\vec{I} = \Sigma \vec{I}_k = \vec{I}_1 + \vec{I}_2 + \ldots + \vec{I}_n$ (n>2, k=1, 2, ..., n). The exciting current space vector on the cross section of the multi-phase winding deflection scanning device can be decomposed into a direct axis (d axis) component $I_d$ and a quadrature axis (q axis) component $I_q$ which are perpendicular to each other, if the exciting current space vector can be expressed into the plural form $\vec{I}_k = I_{kd} + jI_{kq}$ (j represents a unit imaginary number), then $\vec{I} = I_d + jI_q = (I_{1d} + I_{2d} + \ldots + I_{nd}) + j(I_{1q} + I_{2q} + \ldots + I_{nq})$, wherein the exciting current quadrature axis component $I_q$ controls the deflection scanning track of the spot center of the charged particle beam on the work scanning plane to be coincide with the y axis of the rectangular coordinate system and consistent with same in the forward direction.

Preferably, in the step 4, the specific process of decomposing the resultant exciting current data ($I_d$, $I_q$) into the n-phase winding exciting current data $I_1, I_2, \ldots I_n$ according to the circular deflection scanning track principle is as follows:

step 411: defining the serial number of phases of the n-phase winding of the multi-phase winding deflection scanning device, adjusting the position of the deflection scanning device, so that the winding of a certain phase controls the deflection scanning track of the spot center of the charged particle beam on the work scanning plane to be coincide with the x axis of the rectangular coordinate system and consistent with same in the forward direction, that is, defining the winding of the phase the winding of the $1^{st}$ phase, and defining the axis of the winding of the $1^{st}$ phase as a direct axis, when looking additional n−1 phases of winding symmetrically distributed in the counterclockwise direction from the projection on the work scanning plane, defining the additional n−1 phases of winding as the $2^{nd}, 3^{rd}, \ldots, n^{th}$ phases of winding of the deflection scanning device in sequence in the counterclockwise direction; cycling the serial number of phases of winding by n, and normalizing the serial number of phases of winding, that is, normalizing the serial number of phases of winding into the form of nm+a, where m is an integer, a is a positive integer and 1≤a≤n, and a represents the serial number of phases of winding;

step 412: according to symmetrical distribution characteristics, acquiring the included angle $\theta_k$ between the axis of each phase of winding on the cross section of the multi-phase winding deflection scanning device and the direct axis, and the exciting current unit space vector $\theta^{j\theta_k}$ on the axis of each phase of winding;

wherein the phases of winding are identical in number of turns, equal in maximum exciting current and symmetrical in maximum positive and negative amplitude, $|\vec{I}_1|max = |\vec{I}_2|max = \ldots = |\vec{I}_n|_{max} = I_{max}$; if n is odd, the included angles $\theta_1, \theta_2, \ldots, \theta_n$, between the axes of the $1^{st}$ phase of winding, the $2^{nd}$ phase of winding, ..., the $n^{th}$ phase of winding on the cross section of the multi-phase winding deflection scanning device and the direct axis are $$0, \frac{2\pi}{n}, \ldots, \frac{(n-1)2\pi}{n}$$

respectively, the included angle $\Delta\theta_k$ between every two axes of all phases of winding is an integer multiple of $$\Delta\theta = \theta_{k+1} - \theta_k = \frac{2\pi}{n},$$

and the $1^{st}$ phase of winding, the $2^{nd}$ phase of winding, ..., the $n^{th}$ phase of winding respectively correspond to the exciting current unit space vectors $$e^{j0}, e^{j\frac{2\pi}{n}}, \ldots, e^{j\frac{(n-1)2\pi}{n}};$$

if n is even, the included angles $\theta_1, \theta_2, \ldots, \theta_n$ between the axes of the $1^{st}$ phase of winding, the $2^{nd}$ phase of winding, ..., the $n^{th}$ phase of winding on the cross section of the multi-phase winding deflection scanning device and the direct axis are $$\frac{\pi}{n}, \ldots, \frac{(n-1)\pi}{n}$$

respectively, the included angle $\Delta\theta_k$ between every two axes of all phases of winding is an integer multiple of $$\Delta\theta = \theta_{k+1} - \theta_k = \frac{\pi}{n};$$

the $1^{st}$ phase of winding, the $2^{nd}$ phase of winding, ..., the $n^{th}$ phase of winding respectively correspond to the exciting current unit space vectors $$e^{j0}, e^{j\frac{\pi}{n}}, \ldots, e^{j\frac{(n-1)\pi}{n}};$$

step 413: according to the rectangular coordinate data (x, y) of the spot center of the charged particle beam offset on the work scanning plane, obtaining the required resultant exciting current data $(I_d, I_q)$ according to equation (1);

step 414: according to the resultant exciting current data $(I_d, I_q)$, obtaining amplitude I of the resultant exciting current space vector $\vec{I}$ and an included angle $\varphi$ between the resultant exciting current space vector $\vec{I}$ and the direct axis, i.e.

$$I = \sqrt{I_d^2 + I_q^2} \tag{2}$$

$$\varphi = \frac{\pi}{2}, I_d = 0, \quad I_q \geq 0$$
$$\varphi = \frac{3\pi}{2}, \quad I_d = 0, I_q < 0$$
$$\varphi = \arctan\left(\frac{I_q}{I_d}\right), \quad I_d > 0, I_q \geq 0$$
$$\varphi = \pi + \arctan\left(\frac{I_q}{I_d}\right), \quad I_d < 0$$
$$\varphi = 2\pi + \arctan\left(\frac{I_q}{I_d}\right), \quad I_d > 0, I_q < 0$$

step 415: taking the end of the resultant exciting current space vector $\vec{I}$ as one point on the circular deflection scanning track which uses the amplitude I of the resultant exciting current space vector $\vec{I}$ as radius, establishing one-to-one correspondence between the resultant exciting current space vector T and the n-phase winding exciting current data $I_1, I_2, \ldots, I_n$, i.e.

$$\vec{I} = \vec{I}_1 + \vec{I}_2 + \cdots + \vec{I}_n \tag{3}$$

$$I_1 = \frac{2I}{n}\cos(\varphi - \Delta\theta_1) = \frac{2I}{n}\cos\varphi$$

$$I_2 = \frac{2I}{n}\cos(\varphi - \Delta\theta_2) = \frac{2I}{n}\cos(\varphi - \Delta\theta)$$

$$\ldots$$

$$I_n = \frac{2I}{n}\cos(\varphi - \Delta\theta_n) = \frac{2I}{n}\cos(\varphi - (n-1)\Delta\theta)$$

in equation (3), let I be a certain constant value, by the continuous change of $\varphi$ from 0 to $2\pi$, the circular trace of which the radius is I is scanned; as shown in equation (3), when the resultant exciting current space vector $\vec{I}$ is decomposed into the sum of n-phase exciting current space vector components $I_1 e^{j\Theta_1}, I_2 e^{j\Theta_2}, \ldots, I_n e^{j\Theta_n}$ according to the circular deflection scanning track principle, the exciting current data of the winding of each phase is a cosine function of the amplitude $$\frac{2I}{n},$$

the phase angle difference of the cosine function exciting current of each phase is equal to the phase angle difference of the axis of winding in space, and the case of converting a cosine function into a sine function is not excluded.

Preferably, in the step 4, the specific process of decomposing the resultant exciting current data $(I_q, I_d)$ into the n-phase winding exciting current data $I_1, I_2, \ldots, I_n$ according to the 2n-regular-polygon deflection scanning track principle is as follows:

step 421: defining the serial number of phases of the n-phase winding of the multi-phase winding deflection scanning device, adjusting the position of the deflection scanning device, so that the winding of a certain phase controls the deflection scanning track of the spot center of the charged particle beam on the work scanning plane to be coincide with the x axis of the rectangular coordinate system and consistent with same in the forward direction, that is, defining the winding of the phase as the winding of the $1^{st}$ phase, and defining the axis of the winding of the $1^{st}$ phase as a direct axis, when looking additional n−1 phases of winding symmetrically distributed in the counterclockwise direction from the projection on the work scanning plane, defining the additional n−1 phases of winding as the $2^{nd}$, $3^{rd}, \ldots, n^{th}$ phases of winding of the deflection scanning device in sequence in the counterclockwise direction; cycling the serial number of phases of winding by n, and normalizing the serial number of phases of winding, that is, normalizing the serial number of phases of winding into the form of nm+a, where m is an integer, a is a positive integer and $1 \leq a \leq n$, and a represents the serial number of phases of winding;

step 422: according to symmetrical distribution characteristics, acquiring the included angle $\theta_k$ between the axis of each phase of winding on the cross section of the multi-phase winding deflection scanning device and the direct axis, and the exciting current unit space vector $e^{j\theta_k}$ on the axis of each phase of winding;

wherein the phases of winding are identical in number of turns, equal in maximum exciting current and symmetrical in maximum positive and negative amplitude, $|\vec{I}_1|max=|\vec{I}_2|max=\ldots=|\vec{I}_n|_{max}=I_{max}$; if n is odd, the included angles $\theta_1, \theta_2, \ldots, \theta_n$, between the axes of the $1^{st}$ phase of winding, the $2^{nd}$ phase of winding, ..., the $n^{th}$ phase of winding on the cross section of the multi-phase winding deflection scanning device and the direct axis are $$0, \frac{2\pi}{n}, \ldots, \frac{(n-1)2\pi}{n}$$

respectively, the included angle $\Delta\theta_k$ between every two axes of all phases of winding is an integer multiple of $$\Delta\theta = \theta_{k+1} - \theta_k = \frac{2\pi}{n},$$

and the $1^{st}$ phase of winding, the $2^{nd}$ phase of winding, ..., and the $n^{th}$ phase of winding respectively correspond to the exciting current unit space vectors $$e^{j0}, e^{j\frac{2\pi}{n}}, \ldots, e^{j\frac{(n-1)2\pi}{n}};$$

if n is even, the included angles $\theta_1, \theta_2, \ldots, \theta_n$ between the axes of the $1^{st}$ phase of winding, the $2^{nd}$ phase of winding, ..., the $n^{th}$ phase of winding on the cross section of the multi-phase winding deflection scanning device and the direct axis are $$0, \frac{\pi}{n}, \ldots, \frac{(n-1)\pi}{n}$$

respectively, the included angle $\Delta\theta_k$ between every two axes of all phases of winding is an integer multiple of $$\Delta\theta = \theta_{k+1} - \theta_k = \frac{\pi}{n};$$

the $1^{st}$ phase of winding, the $2^{nd}$ phase of winding, ..., the $n^{th}$ phase of winding respectively correspond to the exciting current unit space vectors $$e^{j0}, e^{j\frac{\pi}{n}}, \ldots, e^{j\frac{(n-1)\pi}{n}};$$

step 423: defining axis number for the axis of each phase of winding in the forward and backward directions, wherein 2n virtual axis numbers are defined for the n-phase winding in total; equally dividing the cross section of the multi-phase winding deflection scanning device into 2n sectors, and defining sector number for each of the sectors; and obtaining a correlation between the sectors and the virtual axes;

if n is odd, for the convenience of description and calculation, defining axis number for the axis of each phase of winding in the forward and backward direction respectively, defining the forward axis of the axis of the $k^{th}$ phase of winding as the $(2k-1)^{th}$ virtual axis, defining the backward axis of the axis of the $k^{th}$ phase of winding as the $(2k-1+n)^{th}$ virtual axis, cycling the virtual axis number by 2n, normalizing the virtual axis number, that is, normalizing the virtual axis number into the form of 2nm+b, where m is an integer, b is a positive integer and $1 \leq b \leq 2n$, and b represents the virtual axis number, the exciting current unit space vectors on the $1^{st}, 2^{nd}, \ldots (2n-1)^{th}, 2n^{th}$ virtual axes are $$e^{j0}, e^{j\frac{\pi}{n}}, \ldots, e^{j\frac{(2n-2)\pi}{n}} \text{ and } e^{j\frac{(2n-1)\pi}{n}};$$

defining that the $p^{th}$ sector is located in the range formed by the $p^{th}$ virtual axis and the $(p+1)^{th}$ virtual axis, p=1, 2, ... 2n, wherein if the included angle between the exciting current space vector in the $p^{th}$ sector and the direct axis is $$\varphi, \frac{(p-1)\pi}{n} \leq \varphi < \frac{p\pi}{n},$$

each sector accounting for $$\frac{\pi}{n}$$

angle, cycling the sector number by 2n, normalizing the sector number, that is, normalizing the sector number into the form of 2nm+c, where m is an integer, c is a positive integer and $1 \leq c \leq 2n$, and c represents the sector number; if the edge vector of the 2n-regular-polygon scanning track in the $p^{th}$ sector is parallel to the $$\left(p + \frac{n+1}{2}\right)^{th}$$

virtual axis, represented by $\vec{L}_p$, then $$\vec{L}_p = 2I_v e^{j\frac{(2p+n-1)\pi}{2n}};$$

if n is even, for the convenience of description and calculation, defining axis number for the axis of each phase of winding in the forward and backward direction respectively, defining the forward axis of the axis of the $k^{th}$ phase of winding as the $k^{th}$ virtual axis, defining the backward axis of the axis of the $k^{th}$ phase of winding as the $(k+n)^{th}$ virtual axis, cycling the virtual axis number by 2n, normalizing the virtual axis number, that is, normalizing the virtual axis number into the form of 2nm+b, where m is an integer, b is a positive integer and $1 \leq b \leq 2n$, and b represents the virtual axis number obtained by calculation; the included angle between the $p^{th}$ (p=1, 2, ..., 2n) virtual axis and the $$\left(p + \frac{n}{2}\right)^{th}$$

virtual axis is $$\frac{\pi}{2},$$

and the exciting current unit space vectors on the $1^{st}$, $2^{nd}, \ldots, (2n-1)^{th}, 2n^{th}$ axes are $$e^{j0}, e^{j\frac{\pi}{n}}, \ldots, e^{j\frac{(2n-2)\pi}{n}} \text{ and } e^{j\frac{(2n-1)\pi}{n}};$$

defining the bisector of the $p^{th}$ sector as the $p^{th}$ virtual axis, $p=1, 2, \ldots 2n$, wherein if the included angle between the exciting current space vector in the $p^{th}$ sector and the direct axis is $\varphi$, then $$\frac{(2p-3)\pi}{2n} \leq \varphi < \frac{(2p-1)\pi}{2n},$$

each sector accounting for $$\frac{\pi}{n}$$

angle, cycling the sector number by 2n, normalizing the sector number, that is, normalizing the sector number into the form of 2nm+c, where m is an integer, c is a positive integer and $1 \leq c \leq 2n$, and c represents the sector number, if the edge vector of the 2n-regular-polygon in the $p^{th}$ sector is perpendicular to the $p^{th}$ virtual axis, and is parallel to the $$\left(p+\frac{n}{2}\right)^{th}$$

virtual axis, represented by $\vec{L}_p$, then $$\vec{L}_p = 2I_v e^{j\frac{(2p+n-2)\pi}{2n}};$$

step 424: according to the rectangular coordinate data (x, y) of the spot center of the charged particle beam offset on the work scanning plane, obtaining the required resultant exciting current data ($I_d$, $I_q$) according to equation (1);

step 425: according to the resultant exciting current data ($I_d$, $I_q$), obtaining amplitude I of the resultant exciting current space vector $\vec{I}$ and an included angle $\varphi$ between the resultant exciting current space vector $\vec{I}$ and the direct axis; if n is odd, I and $\varphi$ satisfy the relationship of equation (2); and if n is even, I and $\varphi$ satisfy the relationship of equation (4);

$$I = \sqrt{I_d^2 + I_q^2} \qquad (4)$$

$$\varphi = \frac{\pi}{2} \qquad I_d = 0, I_q \geq 0$$

$$\varphi = \frac{3\pi}{2} \qquad I_d = 0, I_q < 0$$

$$\varphi = \arctan\left(\frac{I_q}{I_d}\right) \qquad I_d > 0, I_q \geq 0$$

$$\varphi = \pi + \arctan\left(\frac{I_q}{I_d}\right) \qquad I_d < 0$$

$$\varphi = \arctan\left(\frac{I_q}{I_d}\right) \qquad I_d > 0, I_q < 0, \arctan\left(\frac{I_q}{I_d}\right) \geq -\frac{\pi}{2n}$$

-continued $$\varphi = 2\pi + \arctan\left(\frac{I_q}{I_d}\right) \qquad I_d > 0, I_1 < 0, \arctan\left(\frac{I_q}{I_d}\right) < -\frac{\pi}{2n}$$

step 426: according to the included angle $\varphi$ between the resultant exciting current space vector $\vec{I}$ and the direct axis, judging that the resultant exciting current space vector $\vec{I}$ is located in the $p^{th}$ sector, and further obtaining an included angle $\alpha$ between the resultant exciting current space vector $\vec{I}$ and the bisector of the $p^{th}$ sector, if n is odd, p and $\alpha$ satisfy the relationship of equation (5); and if n is even, p and $\alpha$ satisfy the relationship of equation (6);

$$p = \text{floor}\left(\frac{\varphi n}{\pi}\right) + 1 \qquad (5)$$

$$\alpha = \varphi - \frac{1}{2}\left[\frac{(p-1)\pi}{n} + \frac{p\pi}{n}\right] = \varphi - \frac{(2p-1)\pi}{2n}$$

$$p = \text{floor}\left(\frac{2n\varphi + \pi}{2\pi}\right) + 1 \qquad (6)$$

$$\alpha = \varphi - \frac{(p-1)\pi}{n}$$

in equation (5) and equation (6), floor is a rounded down function;

step 427: taking the end of the resultant exciting current space vector $\vec{I}$ as one end of the 2n-regular-polygon deflection scanning track on the edge vector $\vec{L}_p$ in the $p^{th}$ sector, according to the included angle $\alpha$ between the resultant exciting current space vector $\vec{I}$ and the bisector of the $p^{th}$ sector in which the resultant exciting current space vector is located, obtaining the exciting current components of the resultant exciting current space vector $\vec{I}$ on the n virtual axes adjacent to the $p^{th}$ sector in the $p^{th}$ sector;

if n is odd, $$\vec{I} = I_v\left(e^{j\frac{(2p-n+1)\pi}{2n}} + \cdots + e^{j\frac{(p-2)\pi}{n}} + \right. \qquad (7)$$

$$\left. e^{j\frac{(p-1)\pi}{n}} + e^{j\frac{p\pi}{n}} + \cdots + e^{j\frac{(2p+n-3)\pi}{2n}} + \beta e^{j\frac{(2p+n-1)\pi}{2n}}\right)$$

$$I_v = I \cos \alpha \, \tan\frac{\pi}{2n}$$

$$\beta I_v = I \sin \alpha$$

according to equation (7), calculating that the exciting current component of the resultant exciting current space vector $\vec{I}$ on each of the $$\left(p-\frac{n-3}{2}\right)^{th}, \ldots, (p-1)^{th}, p^{th}, (p+1)^{th}, \ldots, \left(p+\frac{n-1}{2}\right)^{th}$$

virtual axes in the $p^{th}$ sector is $$I_v = I \cos \alpha \, \tan\frac{\pi}{2n},$$

and the exciting current component on the $$\left(p+\frac{n+1}{2}\right)^{th}$$

virtual axis is $\beta I_v = I \sin \alpha$;

if n is even, $$\vec{I} = I_v\left(e^{j\frac{(3p-n)\pi}{2n}} + \cdots + e^{j\frac{(p-2)\pi}{n}} + \right.$$

$$\left. e^{j\frac{(p-1)\pi}{n}} + e^{j\frac{p\pi}{n}} + \cdots + e^{j\frac{(2p+n-4)\pi}{2n}} + \beta e^{j\frac{(2p+n-2)\pi}{2n}}\right) \quad (8)$$

$$I_v = I \cos \alpha \tan\frac{\pi}{2n}$$

$$\beta I_v = I \sin \alpha$$

according to equation (8), calculating that the exciting current component of the resultant exciting current space vector $\vec{I}$ on each of the $$\left(p-\frac{n-2}{2}\right)^{th},\ldots,(p-1)^{th}, p^{th}, (p+1)^{th},\ldots,\left(p+\frac{n-2}{2}\right)^{th}$$

virtual axes in the $p^{th}$ sector is $$I_v = I \cos \alpha \tan\frac{\pi}{2n},$$

and the exciting current component on the $$\left(p+\frac{n}{2}\right)^{th}$$

virtual axis is $\beta I_v = I \sin \alpha$;

in equation (7) or equation (8), let $I_v(\leq I_{vmax})$ be a certain constant value, by the continuous change of $\beta$ from −1 to 1, the edge vector $\vec{L}_p$ of the 2n-regular-polygon scanning track in the $p^{th}$ sector is scanned.

step 428: naturalizing the exciting current components on the n virtual axes into corresponding exciting current components on the n-phase winding, thus establishing one-to-one correspondence between the resultant exciting current space vector $\vec{I}$ and the n-phase winding exciting current data;

if n is odd, naturalizing the exciting current components of the resultant exciting current space vector $\vec{I}$ in the $p^{th}$ sector on the $$\left(p-\frac{n-3}{2}\right)^{th},\ldots,(p-1)^{th}, p^{th}, (p+1)^{th},\ldots \text{ or,}\left(p+\frac{n+1}{2}\right)^{th}$$

virtual axes into the exciting current on the winding of the $1^{th}$ phase, the $2^{nd}$ phase, . . . , the $n^{th}$ phase, the specific method being as follows: of the $$\left(p-\frac{n-3}{2}\right)^{th},\ldots,(p-1)^{th}, p^{th}, (p+1)^{th},\ldots,\left(p+\frac{n+1}{2}\right)^{th}$$

virtual axis numbers, if the virtual axis number which is odd is expressed into the form of 2k−1, taking the exciting current component on the odd virtual axis number as the forward exciting current of the $k^{th}$ phase of winding, and of the $$\left(p-\frac{n-3}{2}\right)^{th},\ldots,(p-1)^{th}, p^{th}, (p+1)^{th},\ldots,\left(p+\frac{n+1}{2}\right)^{th}$$

virtual axis numbers, if the virtual axis number which is even is expressed into the form of 2k−1+n, taking the exciting current component on the even virtual axis number as the reverse exciting current of the $k^{th}$ phase of winding, the value becoming a negative value; and if n is even, naturalizing the exciting current components of the resultant exciting current space vector $\vec{I}$ in the $p^{th}$ sector on the $$\left(p-\frac{n-2}{2}\right)^{th},\ldots,(p-1)^{th}, p^{th}, (p+1)^{th},\ldots,\left(p+\frac{n-2}{2}\right)^{th}$$

virtual axes into the exciting current on the winding of the $1^{th}$ phase, the $2^{nd}$ phase, . . . , the $n^{th}$ phase, the specific method being as follows: of the $$\left(p-\frac{n-2}{2}\right)^{th},\ldots,(p-1)^{th}, p^{th}, (p+1)^{th},\ldots,\left(p+\frac{n}{2}\right)^{th}$$

virtual axis numbers, if the virtual axis number is not greater than n, making k-virtual axis number, taking the exciting current component on the virtual axis number as the forward exciting current of the $k^{th}$ phase of winding; and of the $$\left(p-\frac{n-2}{2}\right)^{th},\ldots,(p-1)^{th}, p^{th}, (p+1)^{th},\ldots,\left(p+\frac{n}{2}\right)^{th}$$

virtual axis numbers, if the axis number greater than n is expressed into the form of k+n, taking the exciting current component on the virtual axis number as the reverse exciting current of the $k^{th}$ phase of winding, the value becoming a negative value.

As shown in equation (7) or equation (8), when the resultant exciting current space vector $\vec{I}$ is decomposed into the sum of n-phase exciting current $I_1, I_2, \ldots, I_n$ components according to the 2n-regular-polygon deflection scanning track principle, the n−1 amplitude of the exciting current of the n-phase winding are $I_v$, and only the amplitude of the exciting current of the winding of one phase is $\beta I_v$.

Preferably, the calculation of the n-phase exciting current $I_1, I_2, \ldots, I_n$ of all discrete points on the deflection scanning track includes two working modes: off-line calculation and on-line calculation:

the off-line calculation is that: the central controller pre-calculates data of the n-phase exciting current $I_1, I_2, \ldots, I_n$ of all discrete points on the deflection scan track and saves same, after starting the deflection scanning operation of the charged particle beam, the central controller reads the n-phase exciting current $I_1, I_2, \ldots, I_n$ on the deflection scanning track in sequence, and outputs corresponding electrical instruction signals $I_1^*, I_2^*, \ldots, I_n^*$; and the on-line calculation is that: after starting the deflection scanning operation of the charged particle beam, the central controller calculates the n-phase exciting current $I_1, I_2, \ldots, I_n$ of the discrete points on the deflection scan track in every operation period, and outputs corresponding electrical instruction signals $I_1^*, I_2^*, \ldots, I_n^*$.

It can be known from the above technical solution that compared with the prior art, the present invention provides a control method for a multi-phase winding deflection scanning device, comprising: coinciding a deflection scanning track of the $1^{st}$ phase of winding with the x axis of a rectangular coordinate system, defining the axis of the $1^{st}$ phase of winding as a direct axis, and defining the original position of a spot center of a charged particle beam as origin of the rectangular coordinate system; sequentially decomposing the deflection scanning tracks into finite point rectangular coordinate data; proportionally translating the scanning point rectangular coordinate data into corresponding point resultant exciting current data again; decomposing the resultant exciting current data into n-phase winding exciting current data according to the circular deflection scanning track principle or 2n-regular-polygon deflection scanning track principle; converting the n-phase exciting current data into corresponding n-phase control instruction electrical signals by a D/A converter and outputting same to a drive power supply, linearly amplifying the output electrical signals by the n-phase drive circuit of the drive power supply and providing same for corresponding n-phases deflection scanning winding as exciting current.

DESCRIPTION OF DRAWINGS

To more clearly describe the technical solution in the embodiments of the present invention or in the prior art, the drawings required to be used in the description of the embodiments or the prior art will be simply presented below. Apparently, the drawings in the following description are merely the embodiments of the present invention, and for those ordinary skilled in the art, other drawings can also be obtained according to the provided drawings without contributing creative labor.

in FIG. 2: 1—Central controller; 2—Drive power supply; 3—Deflection scanning device; 4—Charged particle beam generator; 41—Charged particle beam; 5—Work scanning plane.

DETAILED DESCRIPTION

The technical solutions in the embodiments of the present invention will be clearly and fully described below in combination with the drawings in the embodiments of the present invention. Apparently, the described embodiments are merely part of the embodiments of the present invention, not all of the embodiments. Based on the embodiments in the present invention, all other embodiments obtained by those ordinary skilled in the art without contributing creative labor will belong to the protection scope of the present invention.

Embodiments of the present invention disclose a control method for a multi-phase winding deflection scanning device. The resultant magnetomotive force of the deflection scanning device is decomposed into the magnetomotive force components of each phase of winding according to a definite rule, one-to-one correspondence between the resultant exciting current space vector and the component exciting current of each phase is established, and corresponding the exciting current of each phase of winding is formed, controlling the deflection scanning of the charged particle beam.

Figure 1:
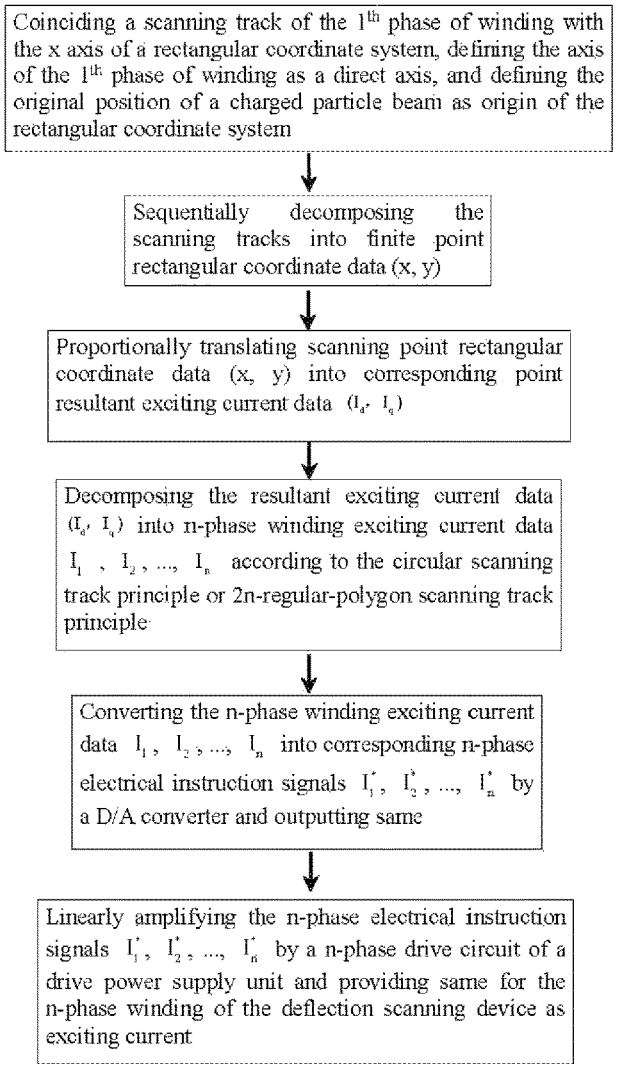
FIG. 1 is a flow chart of a control method for a multi-phase winding deflection scanning device provided by the present invention.
Figure 2:
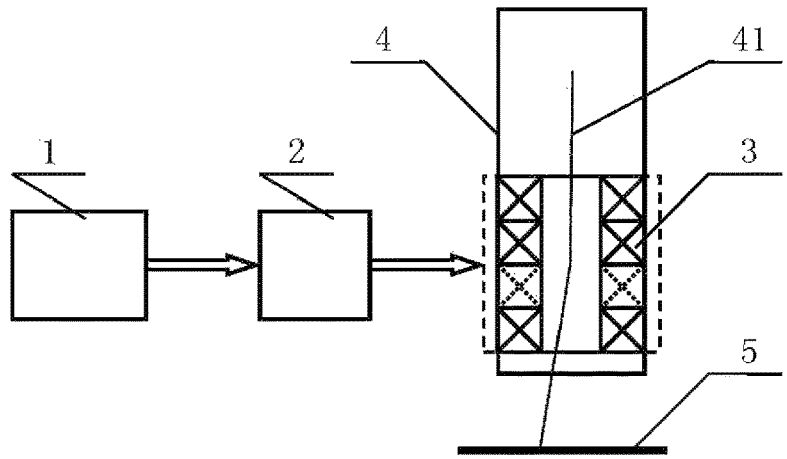
FIG. 2 is a structural schematic diagram of a control system for a multi-phase winding deflection scanning device provided by the present invention.
Figure 3:
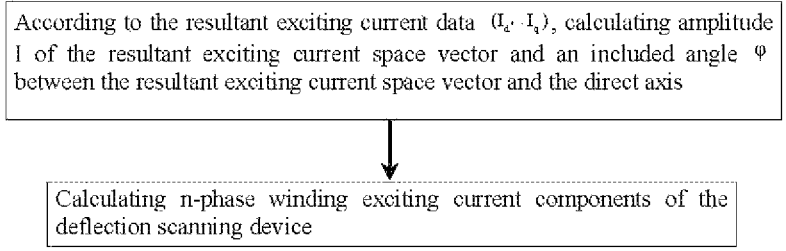
FIG. 3 is a block diagram showing a step of decomposing phase winding exciting current according to the circular deflection scanning track principle provided by the present invention.
Figure 4:
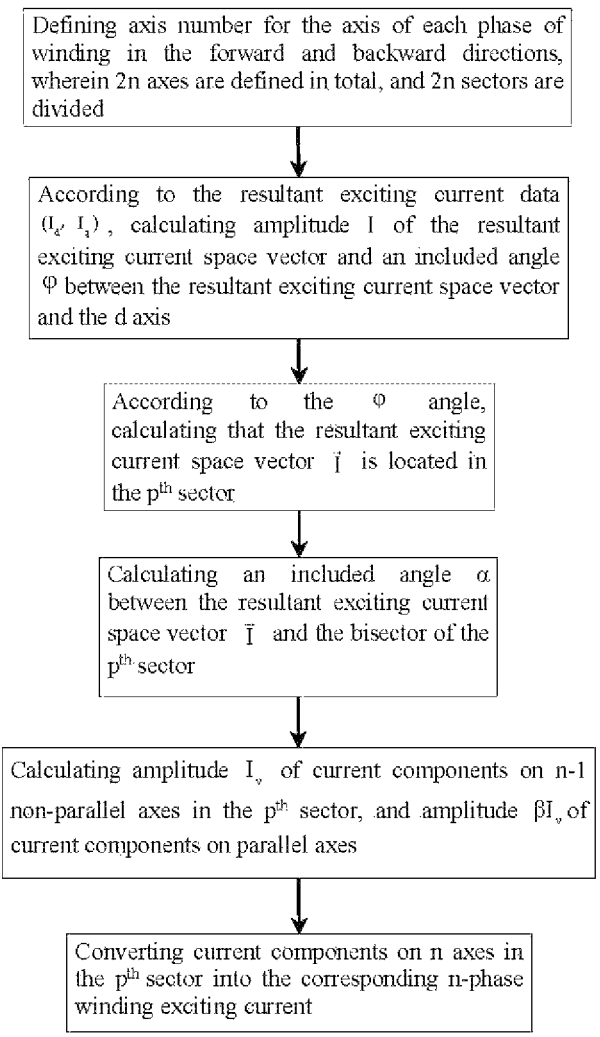
FIG. 4 is a block diagram showing a step of decomposing phase winding exciting current according to the 2n-regular-polygon deflection scanning track principle provided by the present invention.
Figure 5:
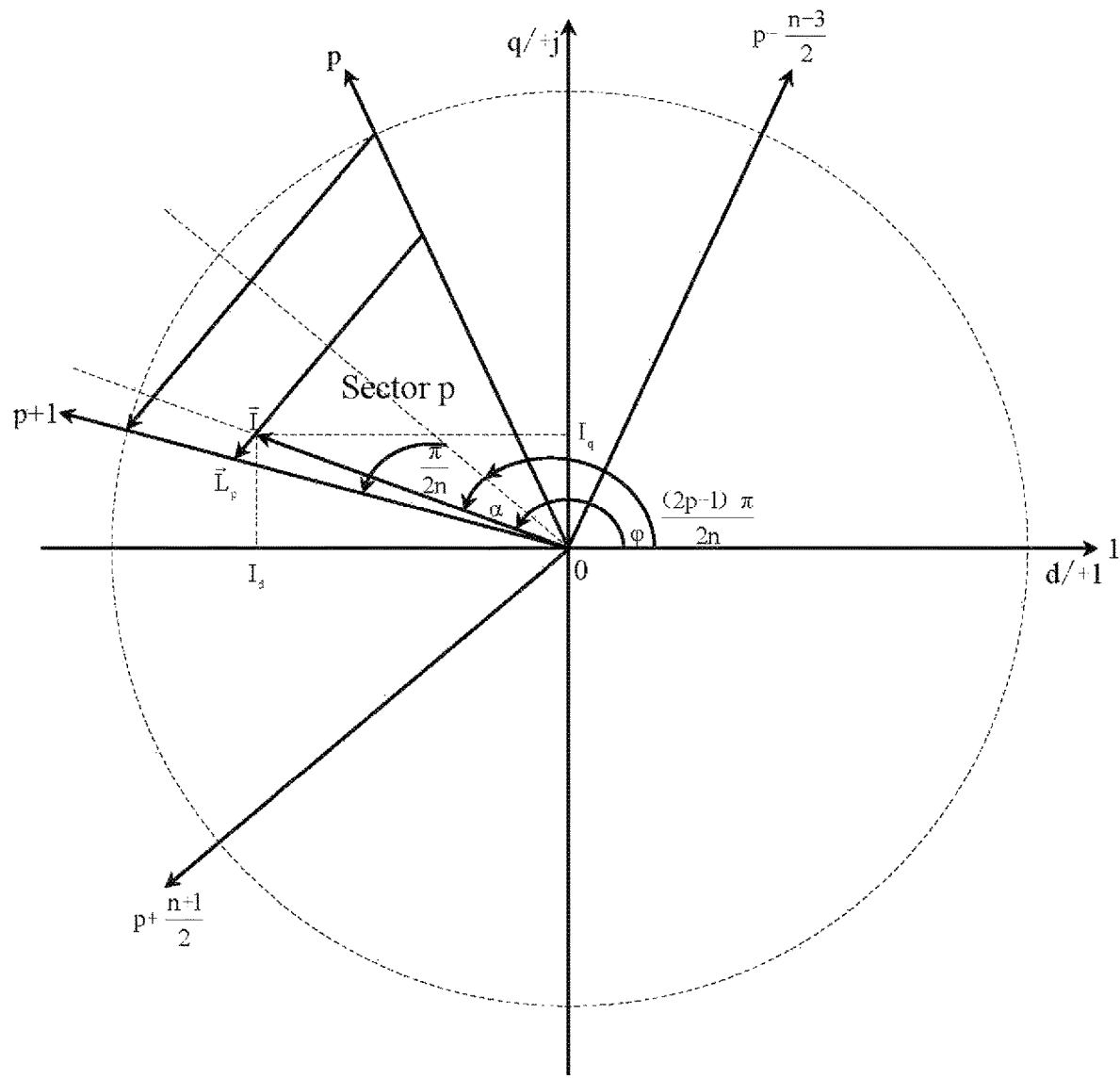
FIG. 5 is a schematic diagram showing a $p^{th}$ sector of decomposing phase winding exciting current of odd phase according to the 2n-regular-polygon deflection scanning track principle provided by the present invention.
Figure 6:
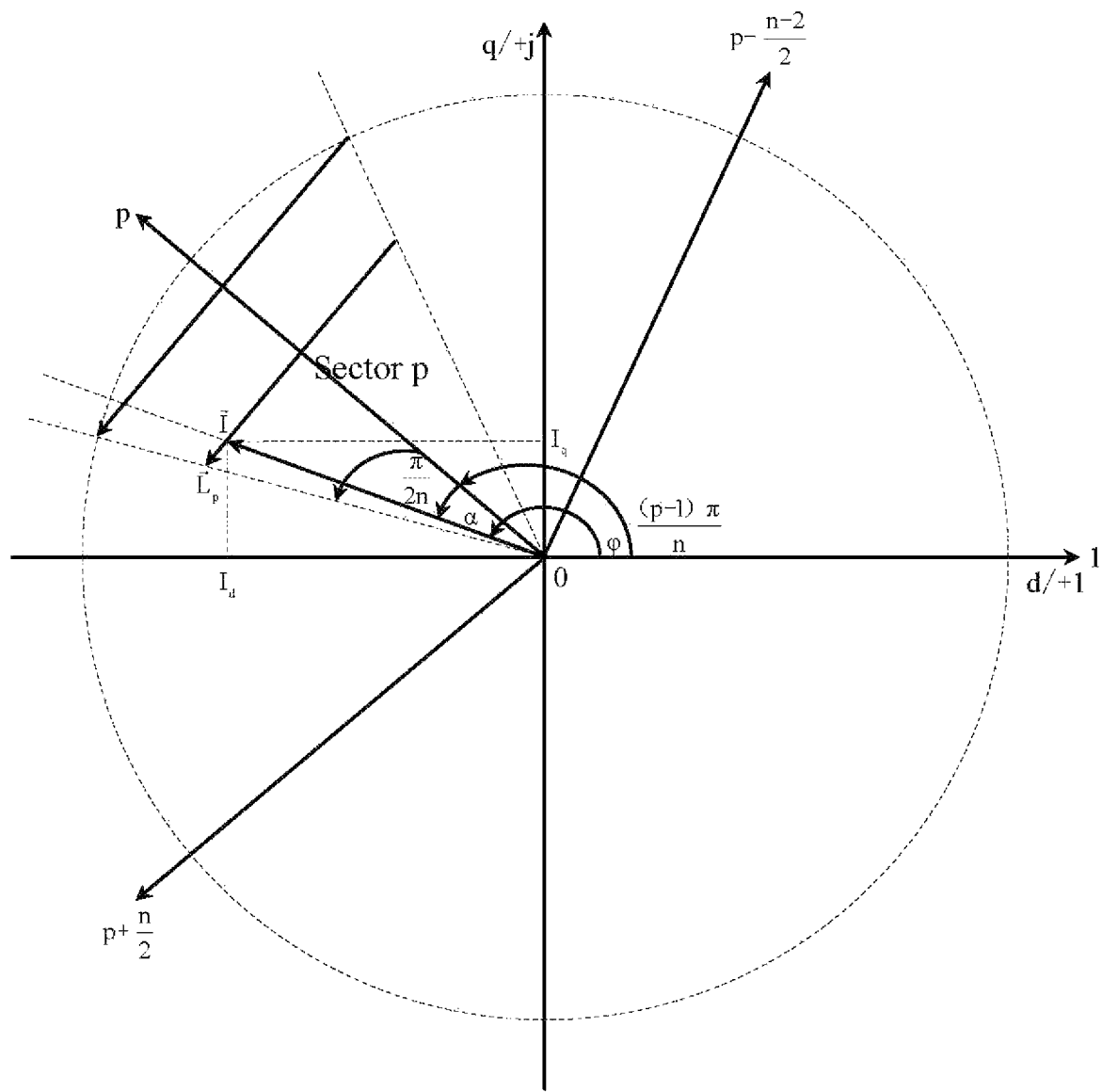
FIG. 6 is a schematic diagram showing a $p^{th}$ sector of decomposing phase winding exciting current of even phase according to the 2n-regular-polygon deflection scanning track principle provided by the present invention.

When the number of phases of winding of the deflection scanning device 3 reaches a certain value, increasing the number of phases is no longer obvious to improving the uniformity of the magnetic field, the larger the number of phases, the more complicated the drive circuit. In engineering, in general, the winding of the general deflection scanning device 3 includes less than 8 phases, and most multi-phase winding structures are 3-phase or 4-phase winding structures. The control steps of embodiments are identical, as shown in FIG. 1, are different in method of evaluating phase exciting current.

Embodiment 1

The included angles between the axes of 3 phases of winding on the cross section of the 3-phase winding deflection scanning device and the direct axis are $$0, \frac{2\pi}{3} \text{ and } \frac{4\pi}{3}$$

respectively, and the included angle $\Delta\theta_k$ between every two axes of all phases of winding is an integer multiple of $$\Delta\theta = \theta_{k+1} - \theta_k = \frac{2\pi}{3}.$$

It is assumed that the resultant exciting current space vector required for the charged particle beam 41 to offset a certain displacement from the original position (0, 0) is $$\vec{I} = I_d + jI_q = \vec{I}e^{j\varphi} = \vec{I}_1 + \vec{I}_2 + \vec{I}_3 = I_1 e^{j0} + I_2 e^{j\frac{2\pi}{3}} + I_3 e^{j\frac{4\pi}{3}}.$$

The exciting current component of each phase is decomposed according to the circular deflection scanning track principle: taking the end of the resultant exciting current space vector $\vec{I}$ as one point on a circular deflection scanning track of which the radius is I, according to equation (2), calculating amplitude I of the resultant exciting current space vector $\vec{I}$ and calculating the included angle $\varphi$ between the resultant exciting current space vector $\vec{I}$ and the direct axis (d axis), according to equation (3), obtaining the exciting current components $$I_1 = \frac{2I}{3}\cos\varphi, \quad I_2 = \frac{2I}{3}\cos\left(\varphi - \frac{2\pi}{3}\right) \text{ and } I_3 = \frac{2I}{3}\cos\left(\varphi - \frac{4\pi}{3}\right)$$

of the $1^{st}$, $2^{nd}$ and $3^{rd}$ phases of winding respectively, thereby establishing one one-to-one correspondence between the resultant exciting current space vector $\vec{I}$ and the component exciting current $I_1$, $I_2$ and $I_3$ of 3 phases of winding of the deflection scanning device 3. If the length of the phase winding scanning line is L, then the maximum circular scanning diameter is 1.5L, and the maximum square scanning area is $$\frac{1.5L}{\sqrt{2}} \times \frac{1.5L}{\sqrt{2}} \approx 1.06L \times 1.06L,$$

while the maximum circular scanning diameter of the 2-phase winding deflection scanning device is L, and the maximum square scanning area is L×L.

Figure 7:
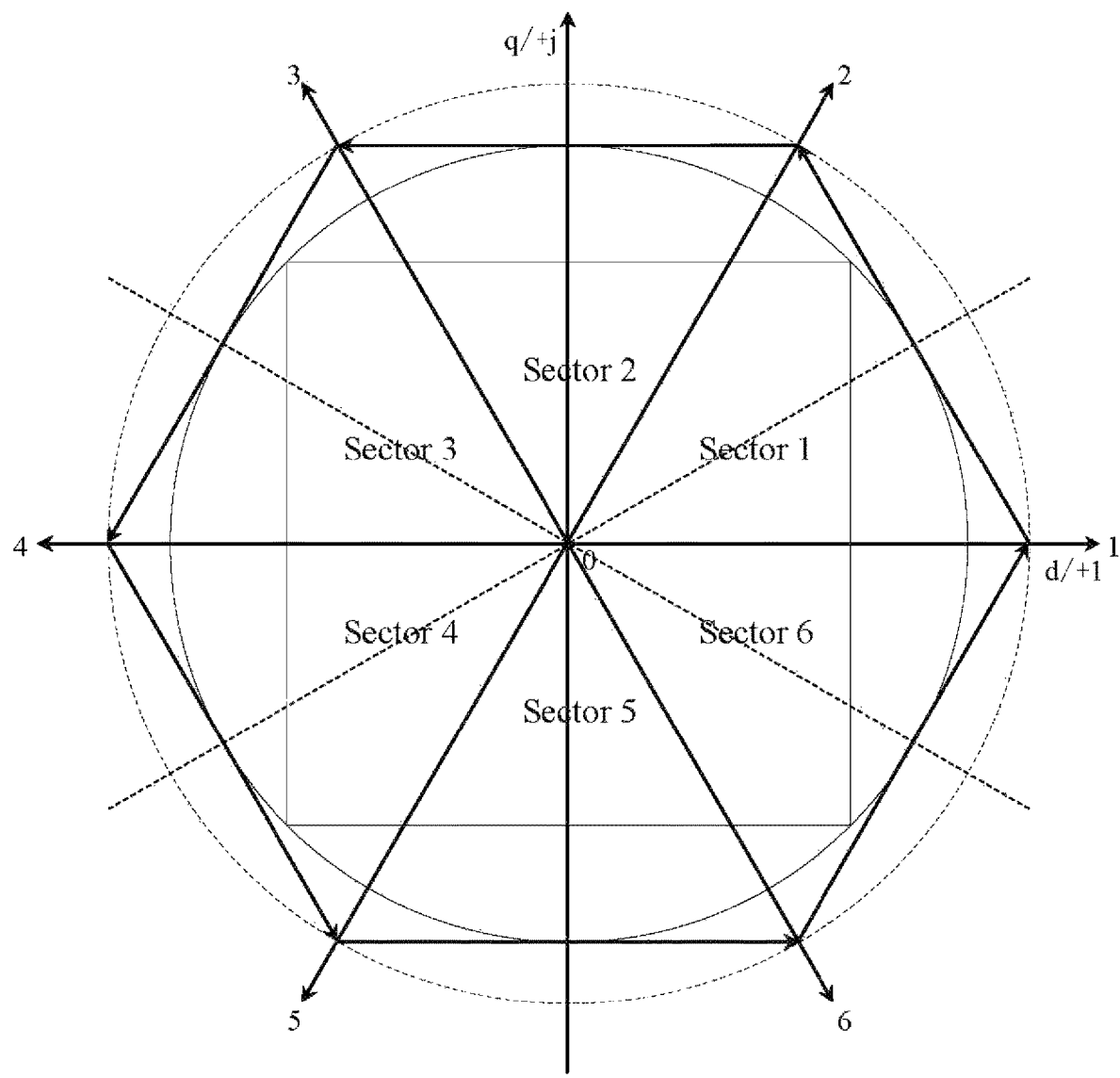
FIG. 7 is a schematic diagram of a sector of a 3-phase winding deflection scanning device in an embodiment provided by the present invention.

The exciting current component of each phase is decomposed according to the 6n-regular polygon deflection scanning track principle: taking the end of the resultant exciting current space vector $\vec{I}$ as one point on a certain 6n-regular polygon deflection scanning track. The space resultant exciting current field on the cross section of the deflection scanning device is divided into 6 sectors, each sector occupying $$\frac{\pi}{3}$$

angle, as shown in FIG. 7. According to equation (2), equation (5) and equation (7), another one-to-one correspondence between the resultant exciting current space vector $\vec{I}$ and the component exciting current $I_1$, $I_2$, $I_3$ of 3 phases of winding of the deflection scanning device 3 can be established, see Table 1 for details. If the length of the phase winding scanning line is L, then the maximum circular scanning diameter is $$\cot\frac{\pi}{6}L = \sqrt{3}L \approx 1.73L,$$

and the maximum square scanning area is $$\frac{\sqrt{3}L}{\sqrt{2}} \times \frac{\sqrt{3}L}{\sqrt{2}} \approx 1.22L \times 1.22L.$$

TABLE 1

| Sector No. | Sector area | Bisector angle | α | $I_1$ | $I_2$ | $I_3$ |
|---|---|---|---|---|---|---|
| 1 | $0 \leq \varphi < \frac{\pi}{3}$ | $\frac{\pi}{6}$ | $\varphi - \frac{\pi}{3}$ | $\frac{\sqrt{3}}{3}I\cos\alpha$ | $I\sin\alpha$ | $-\frac{\sqrt{3}}{3}I\cos\alpha$ |
| 2 | $\frac{\pi}{3} \leq \varphi < \frac{2\pi}{3}$ | $\frac{3\pi}{6}$ | $\varphi - \frac{3\pi}{6}$ | $-I\sin\alpha$ | $\frac{\sqrt{3}}{3}I\cos\alpha$ | $-\frac{\sqrt{3}}{3}I\cos\alpha$ |
| 3 | $\frac{2\pi}{3} \leq \varphi < \pi$ | $\frac{5\pi}{6}$ | $\varphi - \frac{5\pi}{6}$ | $-\frac{\sqrt{3}}{3}I\cos\alpha$ | $\frac{\sqrt{3}}{3}I\cos\alpha$ | $I\sin\alpha$ |
| 4 | $\pi \leq \varphi < \frac{4\pi}{3}$ | $\frac{7\pi}{6}$ | $\varphi - \frac{7\pi}{6}$ | $-\frac{\sqrt{3}}{3}I\cos\alpha$ | $-I\sin\alpha$ | $\frac{\sqrt{3}}{3}I\cos\alpha$ |
| 5 | $\frac{4\pi}{3} \leq \varphi < \frac{5\pi}{3}$ | $\frac{9\pi}{6}$ | $\varphi - \frac{9\pi}{6}$ | $I\sin\alpha$ | $-\frac{\sqrt{3}}{3}I\cos\alpha$ | $\frac{\sqrt{3}}{3}I\cos\alpha$ |
| 6 | $\frac{5\pi}{3} \leq \varphi < 2\pi$ | $\frac{11\pi}{6}$ | $\varphi - \frac{11\pi}{6}$ | $\frac{\sqrt{3}}{3}I\cos\alpha$ | $-\frac{\sqrt{3}}{3}I\cos\alpha$ | $-I\sin\alpha$ |

Embodiment 2

The included angles between the axes of 4 phases of winding on the cross section of the 4-phase winding deflection scanning device and the direct axis are $$0, \frac{\pi}{4}, \frac{\pi}{2} \text{ and } \frac{3\pi}{4}$$

respectively, and the included angle $\Delta\theta_k$ between every two axes of all phases of winding is an integer multiple of $$\Delta\theta = \theta_{k+1} - \theta_k = \frac{\pi}{4}.$$

It is assumed that the resultant exciting current space vector required for the charged particle beam 41 the offset a certain displacement from the original position (0, 0) is $$\vec{I} = I_d + jI_q = \vec{I}e^{j\varphi} = \vec{I}_1 + \vec{I}_2 + \vec{I}_3 + \vec{I}_4 = I_1 e^{j0} + I_2 e^{j\frac{\pi}{4}} + I_3 e^{j\frac{\pi}{2}} + I_4 e^{j\frac{3\pi}{4}}.$$

The exciting current component of each phase is decomposed according to the circular deflection scanning track principle: taking the end of the resultant exciting current space vector $\vec{I}$ as one point on a circular deflection scanning track of which the radius is I, according to equation (2), calculating amplitude I of the resultant exciting current space vector $\vec{I}$ and calculating the included angle $\varphi$ between the resultant exciting current space vector $\vec{I}$ and the direct axis (d axis), according to equation (3), obtaining the exciting current components $$I_1 = \frac{I}{2}\cos\varphi, \ I_2 = \frac{I}{2}\cos\left(\varphi - \frac{\pi}{4}\right), \ I_3 = \frac{I}{2}\sin\varphi \text{ and } I_2 = \frac{I}{2}\sin\left(\varphi - \frac{\pi}{4}\right)$$

of the $1^{st}$, $2^{nd}$, $3^{rd}$, and $4^{th}$ phases of winding respectively, thereby establishing one one-to-one correspondence between the resultant exciting current space vector $\vec{I}$ and the component exciting current $I_1$, $I_2$, $I_3$ and $I_4$ of 4 phases of winding of the deflection scanning device 3. If the length of the phase winding scanning line is L, then the maximum circular scanning diameter is 2L, and the maximum square scanning area is $$\frac{2L}{\sqrt{2}} \times \frac{2L}{\sqrt{2}} \approx 1.41L \times 1.41L.$$

Figure 8:
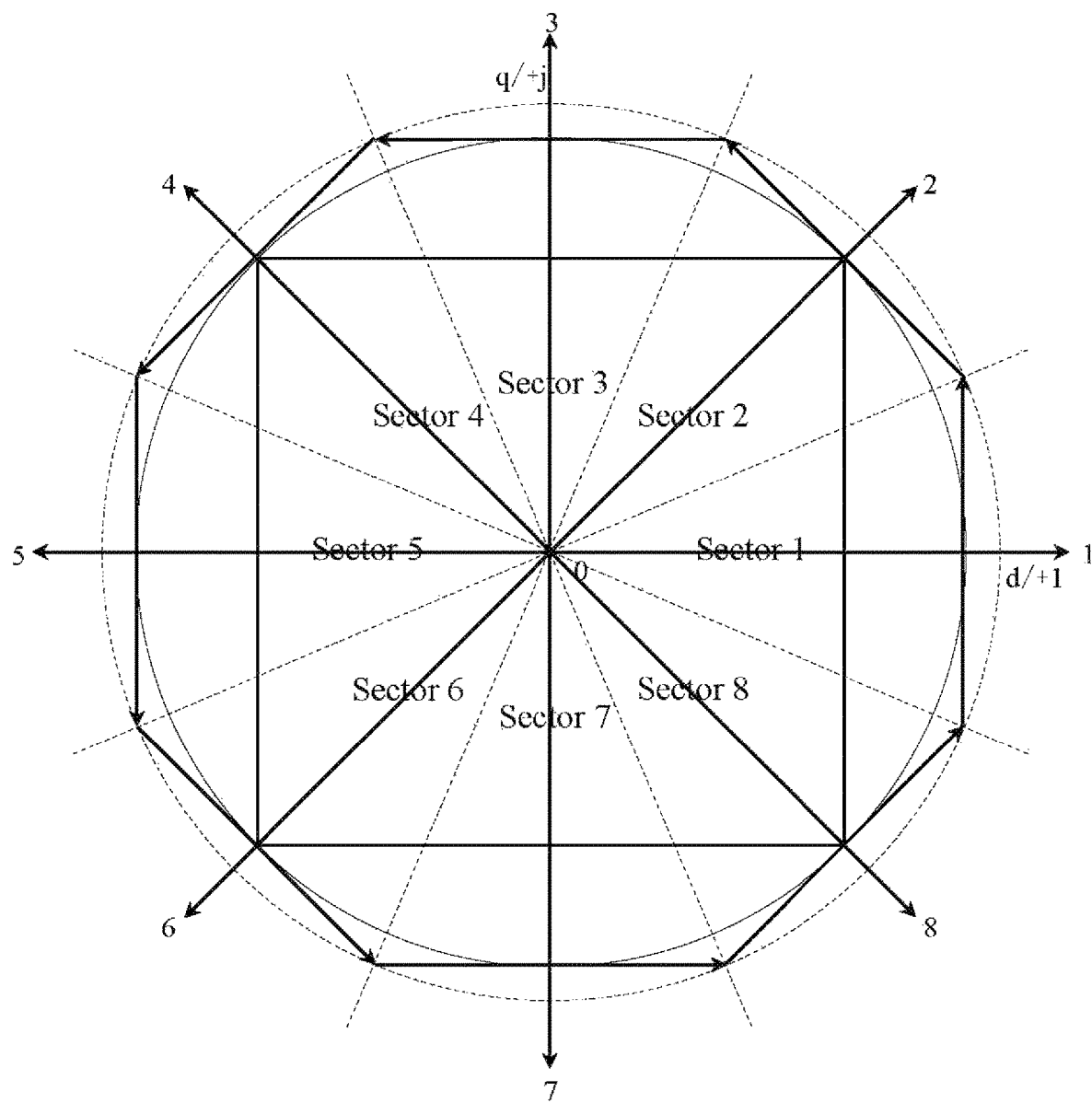
FIG. 8 is a schematic diagram of a sector of a 4-phase winding deflection scanning device with in an embodiment provided by the present invention.

The exciting current component of each phase is decomposed according to the 8n-regular polygon deflection scanning track principle: taking the end of the resultant exciting current space vector $\vec{I}$ as one point on a certain 8n-regular polygon deflection scanning track. The space resultant exciting current field on the cross section of the deflection scanning device is divided into 8 sectors, each sector occupying $$\frac{\pi}{4}$$

angle, as shown in FIG. 8. According to equation (4), equation (6) and equation (8), another one-to-one correspondence between the resultant exciting current space vector $\vec{I}$ and the component exciting current $I_1$, $I_2$, $I_3$ and $I_4$ of 4 phases of winding of the deflection scanning device 3 can be established, see Table 2 for details. If the length of the phase winding scanning line is L, then the maximum circular scanning diameter is $$\cot\frac{\pi}{8}L \approx 2.41L,$$

and the maximum square scanning are is $$\cot\frac{\pi}{8}\frac{L}{\sqrt{2}} \times \cot\frac{\pi}{8}\frac{L}{\sqrt{2}} \approx 1.70L \times 1.70L.$$

TABLE 2

| Sector No. | Sector area | Bisector angle | α | $I_1$ | $I_2$ | $I_3$ | $I_4$ |
|---|---|---|---|---|---|---|---|
| 1 | $-\frac{\pi}{8} \leq \varphi < \frac{\pi}{8}$ | 0 | $\varphi$ | $I\cos\alpha\tan\frac{\pi}{8}$ | $I\cos\alpha\tan\frac{\pi}{8}$ | $I\sin\alpha$ | $-I\cos\alpha\tan\frac{\pi}{8}$ |
| 2 | $\frac{\pi}{8} \leq \varphi < \frac{3\pi}{8}$ | $\frac{\pi}{4}$ | $\varphi - \frac{\pi}{4}$ | $I\cos\alpha\tan\frac{\pi}{8}$ | $I\cos\alpha\tan\frac{\pi}{8}$ | $I\cos\alpha\tan\frac{\pi}{8}$ | $I\sin\alpha$ |
| 3 | $\frac{3\pi}{8} \leq \varphi < \frac{5\pi}{8}$ | $\frac{\pi}{2}$ | $\varphi - \frac{\pi}{2}$ | $-I\sin\alpha$ | $I\cos\alpha\tan\frac{\pi}{8}$ | $I\cos\alpha\tan\frac{\pi}{8}$ | $I\cos\alpha\tan\frac{\pi}{8}$ |
| 4 | $\frac{5\pi}{8} \leq \varphi < \frac{7\pi}{8}$ | $\frac{3\pi}{4}$ | $\varphi - \frac{3\pi}{4}$ | $-I\cos\alpha\tan\frac{\pi}{8}$ | $-I\sin\alpha$ | $I\cos\alpha\tan\frac{\pi}{8}$ | $I\cos\alpha\tan\frac{\pi}{8}$ |
| 5 | $\frac{7\pi}{8} \leq \varphi < \frac{9\pi}{8}$ | $\pi$ | $\varphi - \pi$ | $-I\cos\alpha\tan\frac{\pi}{8}$ | $-I\cos\alpha\tan\frac{\pi}{8}$ | $-I\sin\alpha$ | $I\cos\alpha\tan\frac{\pi}{8}$ |

TABLE 2-continued

| Sector No. | Sector area | Bisector angle | α | $I_1$ | $I_2$ | $I_3$ | $I_4$ |
|---|---|---|---|---|---|---|---|
| 6 | $\frac{9\pi}{8} \leq \varphi < \frac{11\pi}{8}$ | $\frac{5\pi}{4}$ | $\varphi - \frac{5\pi}{4}$ | $-I\cos\alpha\tan\frac{\pi}{8}$ | $-I\cos\alpha\tan\frac{\pi}{8}$ | $-I\cos\alpha\tan\frac{\pi}{8}$ | $-I\sin\alpha$ |
| 7 | $\frac{11\pi}{8} \leq \varphi < \frac{13\pi}{8}$ | $\frac{3\pi}{2}$ | $\varphi - \frac{3\pi}{2}$ | $I\sin\alpha$ | $-I\cos\alpha\tan\frac{\pi}{8}$ | $-I\cos\alpha\tan\frac{\pi}{8}$ | $-I\cos\alpha\tan\frac{\pi}{8}$ |
| 8 | $\frac{13\pi}{8} \leq \varphi < \frac{15\pi}{8}$ | $\frac{7\pi}{4}$ | $\varphi - \frac{7\pi}{4}$ | $I\sin\alpha$ | $I\sin\alpha$ | $-I\cos\alpha\tan\frac{\pi}{8}$ | $-I\cos\alpha\tan\frac{\pi}{8}$ |

Embodiment 3

The included angles between the axes of 5 phases of winding on the cross section of the 5-phase winding deflection scanning device and the direct axis are $$0, \frac{2\pi}{5}, \frac{4\pi}{5}, \frac{6\pi}{5} \text{ and } \frac{8\pi}{5}$$

respectively, and the included angle $\Delta\theta_k$ between every two axes of all phases of winding is an integer multiple of $$\Delta\theta = \theta_{k+1} - \theta_k = \frac{2\pi}{5}.$$

It is assumed that the resultant exciting current space vector required for the charged particle beam 41 to offset a certain displacement from the original position (0, 0) is $$\vec{I} = I_d + jI_q =$$

$$\vec{I}e^{j\varphi} = \vec{I}_1 + \vec{I}_2 + \vec{I}_3 + \vec{I}_4 + \vec{I}_5 = I_1 e^{j0} + I_2 e^{j\frac{2\pi}{5}} + I_3 e^{j\frac{4\pi}{5}} + I_4 e^{j\frac{6\pi}{5}} + I_5 e^{j\frac{8\pi}{5}}.$$

The exciting current component of each phase is decomposed according to the circular deflection scanning track principle: taking the end of the resultant exciting current space vector $\vec{I}$ as one point on a circular deflection scanning track of which the radius is I, according to equation (2), calculating amplitude I of the resultant exciting current space vector $\vec{I}$ and calculating the included angle φ between the resultant exciting current space vector $\vec{I}$ and the direct axis (d axis), according to equation (3), obtaining the exciting current components $$I_1 = \frac{2I}{5}\cos\varphi, I_2 = \frac{2I}{5}\cos\left(\varphi - \frac{2\pi}{5}\right), I_3 = \frac{2I}{5}\cos\left(\varphi - \frac{4\pi}{5}\right),$$

$$I_3 = \frac{2I}{5}\cos\left(\varphi - \frac{6\pi}{5}\right) \text{ and } I_5 = \frac{2I}{5}\cos\left(\varphi - \frac{8\pi}{5}\right)$$

of the 1$^{st}$, 2$^{nd}$, 3$^{rd}$, 4$^{th}$ and 5$^{th}$ phases of winding respectively, thereby establishing one one-to-one correspondence between the resultant exciting current space vector $\vec{I}$ and the component exciting current $I_1$, $I_2$, $I_3$, $I_4$ and $I_5$ of 5 phases of winding of the deflection scanning device 3. If the length of the phase winding scanning line is L, then the maximum circular scanning diameter is 2.5L, and the maximum square scanning area is $$\frac{2.5L}{\sqrt{2}} \times \frac{2.5L}{\sqrt{2}} \approx 1.76L \times 1.76L.$$

Figure 9:
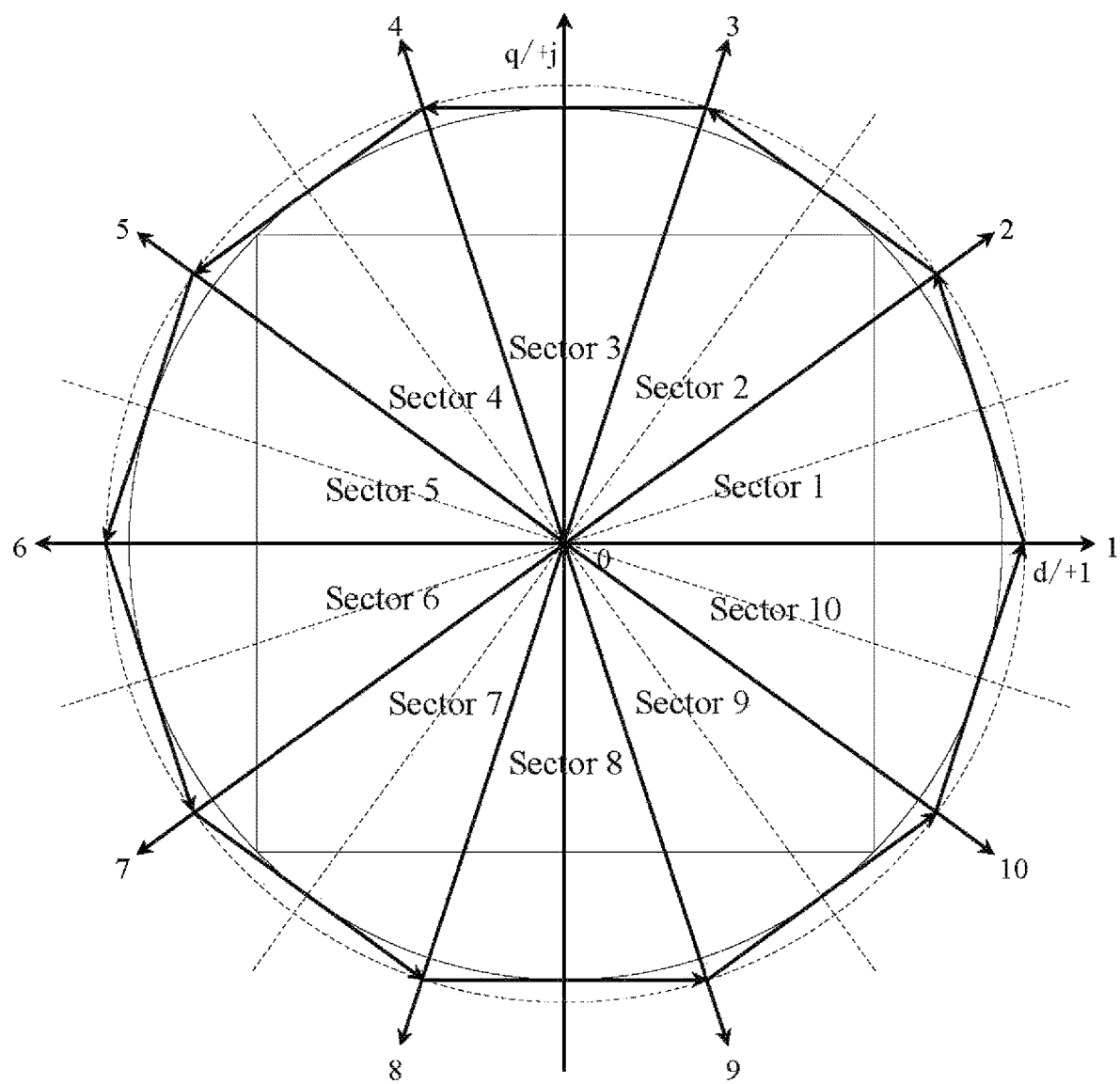
FIG. 9 is a schematic diagram of a sector of a 5-phase winding deflection scanning device in an embodiment provided by the present invention.

The exciting current component of each phase is decomposed according to the 10n-regular polygon deflection scanning track principle: taking the end of the resultant exciting current space vector $\vec{I}$ as one point on a certain 10n-regular polygon deflection scanning track. The space resultant exciting current field on the cross section of the deflection scanning device is divided into 10 sectors, each sector occupying $$\frac{\pi}{5}$$

angle, as shown in FIG. 9. According to equation (2), equation (5) and equation (7), another one-to-one correspondence between the resultant exciting current space vector $\vec{I}$ and the component exciting current $I_1$, $I_2$, $I_3$, $I_4$ and $I_5$ of 5 phases of winding of the deflection scanning device 3 can be established, see Table 3 for details. If the length of the phase winding scanning line is L, then the maximum circular scanning diameter is $$\cot\frac{\pi}{10}L \approx 3.07L,$$

and the maximum square scanning area is $$\cot\frac{\pi}{10}\frac{L}{\sqrt{2}} \times \cot\frac{\pi}{10}\frac{L}{\sqrt{2}} \approx 2.17L \times 2.17L.$$

TABLE 3

| Sector No. | Sector area | Bisector angle | α | $I_1$ | $I_2$ |
|---|---|---|---|---|---|
| 1 | $0 \leq \varphi < \dfrac{\pi}{5}$ | $\dfrac{\pi}{10}$ | $\varphi - \dfrac{\pi}{10}$ | $\cos\alpha \tan\dfrac{\pi}{10}$ | $I \cos\alpha \tan\dfrac{\pi}{10}$ |
| 2 | $\dfrac{\pi}{5} \leq \varphi < \dfrac{2\pi}{5}$ | $\dfrac{3\pi}{10}$ | $\varphi - \dfrac{3\pi}{10}$ | $I \cos\alpha \tan\dfrac{\pi}{10}$ | $I \cos\alpha \tan\dfrac{\pi}{10}$ |
| 3 | $\dfrac{2\pi}{5} \leq \varphi < \dfrac{3\pi}{5}$ | $\dfrac{5\pi}{10}$ | $\varphi - \dfrac{5\pi}{10}$ | $-I \sin\alpha$ | $I \cos\alpha \tan\dfrac{\pi}{10}$ |
| 4 | $\dfrac{3\pi}{5} \leq \varphi < \dfrac{4\pi}{5}$ | $\dfrac{7\pi}{10}$ | $\varphi - \dfrac{7\pi}{10}$ | $-I \cos\alpha \tan\dfrac{\pi}{10}$ | $\cos\alpha \tan\dfrac{\pi}{10}$ |
| 5 | $\dfrac{4\pi}{5} \leq \varphi < \pi$ | $\dfrac{9\pi}{10}$ | $\varphi - \dfrac{9\pi}{10}$ | $-I \cos\alpha \tan\dfrac{\pi}{10}$ | $-I \sin\alpha$ |
| 6 | $\pi \leq \varphi < \dfrac{6\pi}{5}$ | $\dfrac{11\pi}{10}$ | $\varphi - \dfrac{11\pi}{10}$ | $-I \cos\alpha \tan\dfrac{\pi}{10}$ | $-I \cos\alpha \tan\dfrac{\pi}{10}$ |
| 7 | $\dfrac{6\pi}{5} \leq \varphi < \dfrac{7\pi}{5}$ | $\dfrac{13\pi}{10}$ | $\varphi - \dfrac{13\pi}{10}$ | $-I \cos\alpha \tan\dfrac{\pi}{10}$ | $-I \cos\alpha \tan\dfrac{\pi}{10}$ |
| 8 | $\dfrac{7\pi}{5} \leq \varphi < \dfrac{8\pi}{5}$ | $\dfrac{15\pi}{10}$ | $\varphi - \dfrac{15\pi}{10}$ | $I \sin\alpha$ | $-I \cos\alpha \tan\dfrac{\pi}{10}$ |
| 9 | $\dfrac{8\pi}{5} \leq \varphi < \dfrac{9\pi}{5}$ | $\dfrac{17\pi}{10}$ | $\varphi - \dfrac{17\pi}{10}$ | $I \cos\alpha \tan\dfrac{\pi}{10}$ | $-I \cos\alpha \tan\dfrac{\pi}{10}$ |
| 10 | $\dfrac{9\pi}{5} \leq \varphi < 2\pi$ | $\dfrac{19\pi}{10}$ | $\varphi - \dfrac{19\pi}{10}$ | $I \cos\alpha \tan\dfrac{\pi}{10}$ | $I \sin\alpha$ |

| Sector No. | $I_3$ | $I_4$ | $I_5$ |
|---|---|---|---|
| 1 | $-I \cos\alpha \tan\dfrac{\pi}{10}$ | $-I \sin\alpha$ | $-I \sin\alpha$ |
| 2 | $I \sin\alpha$ | $-I \cos\alpha \tan\dfrac{\pi}{10}$ | $-I \cos\alpha \tan\dfrac{\pi}{10}$ |
| 3 | $I \cos\alpha \tan\dfrac{\pi}{10}$ | $-I \cos\alpha \tan\dfrac{\pi}{10}$ | $-I \cos\alpha \tan\dfrac{\pi}{10}$ |
| 4 | $\cos\alpha \tan\dfrac{\pi}{10}$ | $I \sin\alpha$ | $-I \cos\alpha \tan\dfrac{\pi}{10}$ |
| 5 | $I \cos\alpha \tan\dfrac{\pi}{10}$ | $I \cos\alpha \tan\dfrac{\pi}{10}$ | $-I \cos\alpha \tan\dfrac{\pi}{10}$ |
| 6 | $I \cos\alpha \tan\dfrac{\pi}{10}$ | $I \cos\alpha \tan\dfrac{\pi}{10}$ | $I \sin\alpha$ |
| 7 | $-I \sin\alpha$ | $I \cos\alpha \tan\dfrac{\pi}{10}$ | $I \cos\alpha \tan\dfrac{\pi}{10}$ |
| 8 | $-I \cos\alpha \tan\dfrac{\pi}{10}$ | $I \cos\alpha \tan\dfrac{\pi}{10}$ | $I \cos\alpha \tan\dfrac{\pi}{10}$ |
| 9 | $-I \cos\alpha \tan\dfrac{\pi}{10}$ | $-I \sin\alpha$ | $I \cos\alpha \tan\dfrac{\pi}{10}$ |
| 10 | $-I \cos\alpha \tan\dfrac{\pi}{10}$ | $-I \cos\alpha \tan\dfrac{\pi}{10}$ | $I \cos\alpha \tan\dfrac{\pi}{10}$ |

The present invention has the following beneficial effects that:

1. The phase winding exciting current is decomposed according to the circular deflection scanning track principle, if the amplitude of the resultant exciting current is $$\frac{n}{2}$$

times the amplitude of the exciting current of each phase of winding, then the maximum circular scanning diameter of the resultant exciting current space vector is $nI_{vmax}$, and the maximum square scanning edge length of the resultant exciting current space vector is $$\frac{\sqrt{2}n}{2}I_{vmax}.$$

2. The phase winding exciting current is decomposed according to the 2n-regular-polygon deflection scanning track principle, if the maximum deflection scanning track of the resultant exciting current space vector is a 2n-regular-polygon with the edge length of $2I_{vmax}$, then the maximum circular scanning diameter of the resultant exciting current space vector is $$2I_{vmax}\cot\frac{\pi}{2n},$$

and the maximum square scanning edge length of the resultant exciting current space vector is $$\sqrt{2}I_{vmax}\cot\frac{\pi}{2n}.$$

3. A bigger scanning circle and square can be obtained by decomposing the phase winding exciting current according to the 2n-regular-polygon deflection scanning track principle than decomposing the phase winding exciting current according to the circular deflection scanning track principle, being beneficial to giving full play to the performance of the multi-phase winding deflection scanning device.

4. One-to-one correspondence is established between the resultant exciting current space vector and the component exciting current of each phase, which plays a key bridge role for the digital control of the multi-phase winding deflection scanning device, and provides guarantee for accurate correction of astigmatism caused by deflection scanning.

Each embodiment in the description is described in a progressive way. The difference of each embodiment from each other is the focus of explanation. The same and similar parts among all of the embodiments can be referred to each other. For the device disclosed by the embodiments, because the device corresponds to a method disclosed by the embodiments, the device is simply described. Refer to the description of the method part for the related part.

The above description of the disclosed embodiments enables those skilled in the art to realize or use the present invention. Many modifications to these embodiments will be apparent to those skilled in the art. The general principle defined herein can be realized in other embodiments without departing from the spirit or scope of the present invention. Therefore, the present invention will not be limited to these embodiments shown herein, but will conform to the widest scope consistent with the principle and novel features disclosed herein.

The invention claimed is:

1. A control method for a multi-phase winding deflection scanning device, comprising:
    step 1: defining a coordinate axis;
    step 2: discretizing and digitizing a deflection scanning track of the multi-phase winding deflection scanning device (3), obtaining rectangular coordinate data (x, y) of finite scanning points on the deflection scanning track, and saving the data;
    step 3: translating the rectangular coordinate data (x, y) of the scanning points on the deflection scanning track into resultant exciting current data ($I_d$, $I_q$), where $I_d$ represents direct axis component data, and $I_q$ represents quadrature axis component data;
    step 4: decomposing the resultant exciting current data ($I_d$, $I_q$) into n-phase winding exciting current data $I_1$, $I_2$, . . . , $I_n$ according to a definite rule;
    step 5: generating n-phase control instruction electrical signals $I_1^*$, $I_2^*$, . . . , $I_n^*$ according to the n-phase winding exciting current data $I_1$, $I_2$, . . . , $I_n$; and
    step 6: generating n-phase exciting current according to the n-phase control instruction electrical signals $I_1^*$, $I_2^*$, . . . , $I_n^*$, wherein the multi-phase winding deflection scanning device (3) achieves the function of controlling the deflection scanning track.

2. The control method for a multi-phase winding deflection scanning device according to claim 1, wherein a control system for the multi-phase winding deflection scanning device controls a deflection scanning track of a charged particle beam, the control system for the multi-phase winding deflection scanning device comprising a central controller (1), a drive power supply (2), and a multi-phase winding deflection scanning device (3), wherein the central controller (1) is connected with the drive power supply (2), and the drive power supply (2) is connected with the multi-phase winding deflection scanning device (3); the multi-phase winding deflection scanning device (3) is mounted at the outlet end of a charged particle beam generator (4); a charged particle beam (41) generated by the charged particle beam generator (4) is projected onto a work scanning plane (5) by the deflection scanning device (3), to form the deflection scanning track on the work scanning plane (5); the drive power supply (2) generates n-phase exciting current according to the n-phase control instruction electrical signals $I_1^*$, $I_2^*$, . . . , $I_n^*$ transmitted by the central controller (1), so that the multi-phase winding deflection scanning device (3) controls the spot center of the charged particle beam (41) on the work scanning plane (5) to be offset to the rectangular coordinate system (x, y) position.

3. The control method for a multi-phase winding deflection scanning device according to claim 2, wherein the step 1 is specifically implemented as follows: adjusting the position of the deflection scanning device (3), so that the winding of the $1^{st}$ phase controls the deflection scanning track of the spot center of the charged particle beam (41) on the work scanning plane (5) to be coincide with the x axis of the rectangular coordinate system and consistent with same in the forward direction, wherein the axis of the winding of the $1^{st}$ phase is defined as a direct axis on the cross section of the deflection scanning device (3), when looking additionally distributed n−1 phases of winding from the projection on the work scanning plane (5), the n−1 phases of winding are defined as the $2^{nd}, 3^{rd}, \ldots, n^{th}$ phases of winding of the deflection scanning device (3) in sequence in the counterclockwise direction of the winding of the $1^{st}$ phase; when the resultant exciting current is zero, the position of the spot center of the charged particle beam (41) projected on the work scanning plane (5) is defined as the origin (0, 0) of the rectangular coordinate system on the work scanning plane (5).

4. The control method for a multi-phase winding deflection scanning device according to claim 1, wherein the step 3 is specifically implemented as follows: proportionally converting, by the central controller, the rectangular coordinate data (x, y) of the deflection scanning track point into corresponding point resultant exciting current data ($I_d$, $I_q$), $$I_d = \lambda x$$

$$I_q = \lambda y \quad (1)$$

where $\lambda$ is set as a constant.

5. The control method for a multi-phase winding deflection scanning device according to claim 1, wherein the step 4 is specifically implemented as follows: decomposing, by the central controller (1), the resultant exciting current data ($I_d$, $I_q$) obtained in the step 3 into the n-phase winding exciting current data $I_1, I_2, \ldots, I_n$ according to the circular scanning track principle or 2n-regular-polygon scanning track principle.

6. The control method for a multi-phase winding deflection scanning device according to claim 1, wherein the step 5 is specifically implemented as follows: inputting, by the central controller (1), the n-phase winding exciting current data $I_1, I_2, \ldots, I_n$ obtained in the step 4 into an n-channel D/A converter respectively to convert same into corresponding n-phase control instruction electrical signals $I_1^*$, $I_2^*, \ldots, I_n^*$, and transmitting the electrical signals to the instruction signal input end of a corresponding n-phase drive circuit in the drive power supply (2) respectively.

7. The control method for a multi-phase winding deflection scanning device according to claim 1, wherein the step 6 is specifically implemented as follows: receiving, by the drive power supply (2), the n-phase control instruction electrical signals $I_1^*, I_2^*, \ldots, I_n^*$ and transmitting same to the n-phase drive circuit in the drive power supply (2), linearly amplifying, by the n-phase drive circuit, the electrical signals, and then transmitting same to corresponding phase deflection scanning winding of the multi-phase winding deflection scanning device (3) as the exciting current respectively.

8. The control method for the multi-phase winding deflection scanning device according to claim 5, wherein in the step 4, the specific process of decomposing the resultant exciting current data ($I_d$, $I_q$) into the n-phase winding exciting current data $I_1, I_2, \ldots, I_n$ according to the circular deflection scanning track principle is as follows:

step 411: defining the serial number of phases of the n-phase winding of the multi-phase winding deflection scanning device (3);

step 412: according to symmetrical distribution characteristics, acquiring the included angle $\theta_k$ between the axis of each phase of winding on the cross section of the multi-phase winding deflection scanning device (3) and the direct axis, and the exciting current unit space vector $e^{j\theta_k}$ on the axis of each phase of winding;

step 413: according to the rectangular coordinate data (x, y) of the spot center of the charged particle beam (41) offset on the work scanning plane (5), obtaining the required resultant exciting current data ($I_d$, $I_q$);

step 414: according to the resultant exciting current data ($I_d$, $I_q$), obtaining amplitude I of the resultant exciting current space vector $\vec{I}$ and an included angle $\varphi$ between the resultant exciting current space vector $\vec{I}$ and the direct axis; and step 415: taking the end of the resultant exciting current space vector $\vec{I}$ as one point on the circular deflection scanning track which uses the amplitude I of the resultant exciting current space vector $\vec{I}$ as radius, establishing one-to-one correspondence between the resultant exciting current space vector $\vec{I}$ and the n-phase winding exciting current data $I_1, I_2, \ldots, I_n$.

9. The control method for the multi-phase winding deflection scanning device according to claim 5, wherein in the step 4, the specific process of decomposing the resultant exciting current data ($I_d$, $I_q$) into the n-phase winding exciting current data $I_1, I_2, \ldots, I_n$ according to the 2n-regular-polygon deflection scanning track principle is as follows:

step 421: defining the serial number of phases of the n-phase winding of the multi-phase winding deflection scanning device (3);

step 422: according to symmetrical distribution characteristics, acquiring the included angle $\theta_k$ between the axis of each phase of winding on the cross section of the multi-phase winding deflection scanning device (3) and the direct axis, and the exciting current unit space vector $e^{j\theta_k}$ on the axis of each phase of winding;

step 423: defining axis number for the axis of each phase of winding in the forward and backward directions, wherein 2n virtual axis numbers are defined for the n-phase winding in total; equally dividing the cross section of the multi-phase winding deflection scanning device (3) into 2n sectors, and defining sector number for each of the sectors; and obtaining a correlation between the sectors and the virtual axes;

step 424: according to the rectangular coordinate data (x, y) of the spot center of the charged particle beam (41) offset on the work scanning plane (5), obtaining the required resultant exciting current data ($I_d$, $I_q$);

step 425: according to the resultant exciting current data ($I_d$, $I_q$), obtaining amplitude I of the resultant exciting current space vector $\vec{I}$, and an included angle $\varphi$ between the resultant exciting current space vector $\vec{I}$ and the direct axis;

step 426: according to the included angle $\varphi$ between the resultant exciting current space vector $\vec{I}$ and the direct axis, judging that the resultant exciting current space vector $\vec{I}$ is located in the $p^{th}$ sector, and further obtaining an included angle $\alpha$ between the resultant exciting current space vector $\vec{I}$ and the bisector of the $p^{th}$ sector;

Step 427: taking the end of the resultant exciting current space vector $\vec{I}$ as one point of the 2n-regular-polygon deflection scanning track on an edge vector $\vec{I}_p$, in the $p^{th}$ sector, according to the included angle $\alpha$ between the resultant exciting current space vector $\vec{I}$ and the bisector of the $p^{th}$ sector in which the resultant exciting current space vector is located, obtaining the exciting current components of the resultant exciting current space vector $\vec{I}$ on the n virtual axes adjacent to the $p^{th}$ sector in the $p^{th}$ sector; and step 428: naturalizing the exciting current components on the n virtual axes into corresponding exciting current components on the n-phase winding, thereby establishing one-to-one correspondence between the resultant exciting current space vector $\vec{I}$ and the n-phase winding exciting current data.

\* \* \* \* \*